(12) United States Patent
Pham et al.

(10) Patent No.: US 6,838,322 B2
(45) Date of Patent: Jan. 4, 2005

(54) METHOD FOR FORMING A DOUBLE-GATED SEMICONDUCTOR DEVICE

(75) Inventors: Daniel T. Pham, Austin, TX (US); Alexander L. Barr, Austin, TX (US); Leo Mathew, Austin, TX (US); Bich-Yen Nguyen, Austin, TX (US); Anne M. Vandooren, Austin, TX (US); Ted R. White, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/427,577

(22) Filed: May 1, 2003

(65) Prior Publication Data

US 2004/0219722 A1 Nov. 4, 2004

(51) Int. Cl.[7] .................. H01L 21/00; H01L 21/20; H01L 21/3205
(52) U.S. Cl. .............. 438/151; 438/152; 438/157; 438/166; 438/482; 438/486; 438/585; 438/587; 438/588
(58) Field of Search ................... 438/151, 152, 438/166, 482, 486, 585, 587, 157, 588

(56) References Cited

U.S. PATENT DOCUMENTS

| | | | | |
|---|---|---|---|---|
| 5,629,223 A | * | 5/1997 | Thakur | 438/398 |
| 5,707,882 A | * | 1/1998 | Hamada et al. | 438/166 |
| 5,893,949 A | * | 4/1999 | King et al. | 117/97 |
| 5,930,657 A | * | 7/1999 | Kim et al. | 438/482 |
| 6,396,108 B1 | * | 5/2002 | Krivokapic et al. | 257/365 |
| 6,413,801 B1 | | 7/2002 | Lin | |
| 6,413,802 B1 | | 7/2002 | Hu et al. | |
| 6,429,484 B1 | * | 8/2002 | Yu | 257/347 |
| 6,525,403 B2 | * | 2/2003 | Inaba et al. | 257/618 |
| 6,689,650 B2 | * | 2/2004 | Gambino et al. | 438/157 |
| 2001/0036731 A1 | * | 11/2001 | Muller et al. | 438/689 |
| 2003/0151077 A1 | * | 8/2003 | Mathew et al. | 257/250 |

* cited by examiner

*Primary Examiner*—Mary Wilczewski
*Assistant Examiner*—Toniae M. Thomas
(74) *Attorney, Agent, or Firm*—James L. Clingan, Jr.

(57) ABSTRACT

A method for forming a polysilicon FinFET (10) or other thin film transistor structure includes forming an insulative layer (12) over a semiconductor substrate (14). An amorphous silicon layer (32) forms over the insulative layer (12). A silicon germanium seed layer (44) forms in association with the amorphous silicon layer (32) for controlling silicon grain growth. The polysilicon layer arises from annealing the amorphous silicon layer (32). During the annealing step, silicon germanium seed layer (44), together with silicon germanium layer (34), catalyzes silicon recrystallization to promote growing larger crystalline grains, as well as fewer grain boundaries within the resulting polysilicon layer. Source (16), drain (18), and channel (20) regions are formed within the polysilicon layer. A double-gated region (24) forms in association with source (16), drain (18), and channel (20) to produce polysilicon FinFET (10).

21 Claims, 6 Drawing Sheets

US 6,838,322 B2

METHOD FOR FORMING A DOUBLE-GATED SEMICONDUCTOR DEVICE

FIELD OF THE INVENTION

The present invention relates to semiconductor devices and, more particularly, to a method for forming a double-gated semiconductor device using polysilicon.

BACKGROUND OF THE INVENTION

As the semiconductor industry approaches scaling limits for CMOS processes and technology, integrated circuit manufacturers are rigorously evaluating different types of ultra thin-body transistor structures. As a result of these efforts, it is expected that some non-classical transistor structures will become far more widely accepted and in use. This increasing popularity will be due to their exhibiting higher performance with lower leakage than that which traditional scaled CMOS approaches demonstrate. Double-gated and ultra thin-body MOSFETs offer paths to further scaling. Double-gated transistors, for example, allow twice the drive current, with an inherent coupling between the gates and channel that makes the design more scalable.

At reduced gate lengths, these types of devices have difficulty in maintaining high drive currents ($I_{on}$) with low leakage ($I_{off}$) while not demonstrating short-channel effects such as leakage and threshold voltage stability. Bulk silicon planar CMOS devices typically overcome these problems by scaling polysilicon gates and oxides, using super-steep retrograde wells (often triple wells), abrupt source/drain junctions and highly-doped channels. At some point, however, intense channel doping begins to degrade carrier mobility and junction characteristics.

To fabricate devices beyond current scaling limits, integrated circuit designers simultaneously seek to push the planar, bulk silicon CMOS design while exploring alternative gate stack materials, band engineering methods (such as using strained Si or SiGe), and alternative transistor structures.

The double-gated MOSFET provides a particularly promising candidate for ultimate CMOS scaling, due to its better control of near-ideal sub-threshold slope and mobility enhancement. The two gates control roughly twice as much current as a single gate, which allows them to produce significantly stronger switching signals. The two-gate design provides inherent electrostatic and hot-carrier coupling in the channel. This intimate coupling between the gates and channel makes double-gated MOSFET technology one of the most scalable of all FET designs. A significant limitation of this technology, however, relates to the inability of these designs to obtain suitable threshold voltages for high-speed logic devices while controlling extrinsic resistance.

One approach to addressing this limitation, known as a "FinFET," provides a type of double-gated MOSFET device wherein the gate structure wraps around a thin silicon body (forming the "fin"). The FinFET includes a forward protruding source and an asymmetrically protruding drain behind the gate.

Of the different double-gated approaches a designer might use, the FinFET is one of the easiest to fabricate. Unfortunately, known FinFET fabrication processes require the use of an expensive SOI substrate. The requirement of an SOI substrate poses two significant limitations. First of all, using the comparatively more expensive SOI substrate adds significant costs to the device fabrication process. Secondly, processing the FinFET device over an SOI substrate can yield only a single-layer device. Accordingly, the previously mentioned scaling limitations soon re-emerge. This is because lithographic limits soon constrain the dimensions of features that may be used on the single-layer SOI substrate.

BRIEF DESCRIPTION OF THE DRAWINGS

The following drawings illustrate a method for forming a polysilicon double-gated semiconductor device such as polysilicon FinFET, the drawings are to be viewed in conjunction with a reading of the following Detailed Description and are described as follows.

DETAILED DESCRIPTION

Figure 1:
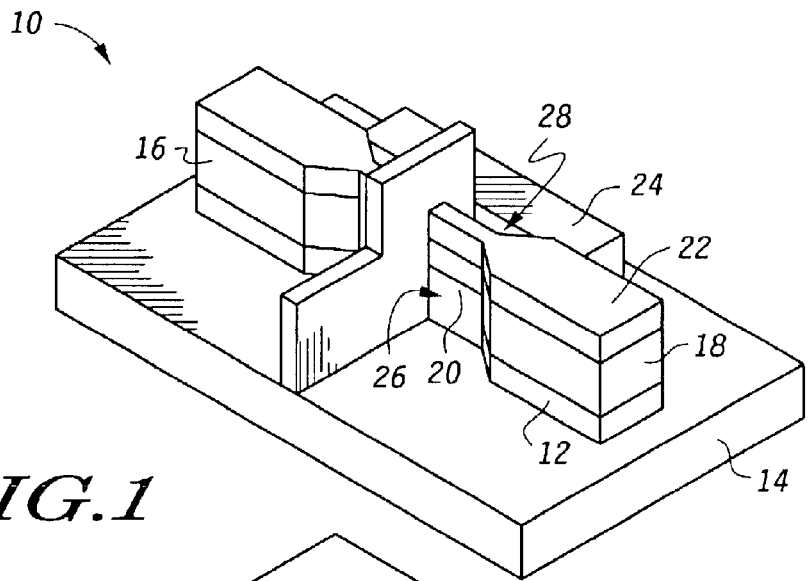
FIG. 1 shows one embodiment of a polysilicon FinFET formed according to the teachings of the present invention.

Generally, the present invention provides a method for forming a double-gated semiconductor device using a polysilicon film that exhibits a sufficiently large grain size to form a FinFET or similar device having desirable operational characteristics. FIG. 1 shows a perspective view of one embodiment of the present invention as a vertical, self-aligned double-gated polysilicon FinFET 10 built including an insulative layer 12 over silicon substrate 14. Between source 16 and drain 18, polysilicon FinFET 10 includes channel 20. Dielectric layer and hard mask 22 covers source 16, drain 18, and channel 20. Source 16, drain 18, and channel 20 are formed through a process that begins with the deposition of an amorphous silicon layer.

As the discussion which follows explains in greater detail, the process of the present invention anneals the amorphous silicon layer to yield a polysilicon layer. Source 16, drain 18, and channel 20 are defined by patterning and etching the polysilicon layer. A dielectric hard mask 22 on source 16, drain 18, and channel 20 aids in this process. After forming a gate dielectric, a gate electrode 24 is formed to wrap around the two sides 26 and 28 of channel 20 as a self-aligned double-gated structure Channel 20 extends horizontally on silicon substrate with the two gate surfaces being self-aligned in planes on sides 26 and 28. By virtue of this construction, inversion layers may form on both sides 26 and 28 of channel 20. Polysilicon FinFET 10, therefore, has the advantage of providing a double gate structure to effectively suppress short channel effects and enhance drive current. The present invention forms polysilicon FinFET 10 and other similar devices in a novel way that addresses the limitations already described and provides the benefits herein explained.

Among other novel features and advantages, the present invention makes use of a silicon germanium seed layer to control the formation of a polysilicon layer from an amorphous silicon layer. In one embodiment, the silicon germanium layer not only covers, but also presents sidewalls to interface the amorphous silicon layer. In another embodiment, the silicon germanium layer simply covers the amorphous silicon layer. The present invention uses the silicon germanium layer as a single crystal seed to start the crystalline grain growth and transform or recrystallize the amorphous silicon layer into a polysilicon layer. In other words, crystalline structures may or may not exist in the amorphous silicon. In the recrystallization step that transforms the amorphous silicon layer into a polysilicon layer, the single crystal silicon germanium layer affects or catalyzes the resulting new crystalline structures to have larger grain sizes and correspondingly fewer grain boundaries. The larger grain sizes cause the polysilicon FinFET 10 performance to improve significantly. Either a wet etch using a mixture of NH4OH+H2O2+deionized water chemistry or a dry etch of any standard silicon etch, such as a chlorine-, SF4-, or CF4-based silicon etch that is selective to silicon then removes the silicon germanium seed layer. The remaining polysilicon layer can then be further processed to form the desired transistor device according to known FinFET fabrication steps.

These and other features and advantages of the present invention will become more clearly understood from the remaining portion of this Detailed Description which is to be taken in conjunction with the FIGS. 2 through 14. It is important to point out, however, that the illustrations are not necessarily drawn to scale, and that there are likely to be other embodiments of the present invention which are not specifically illustrated. Furthermore, it is important to note that like reference numerals are sometimes used throughout the several figures to designate identical or corresponding parts.

Figure 2:
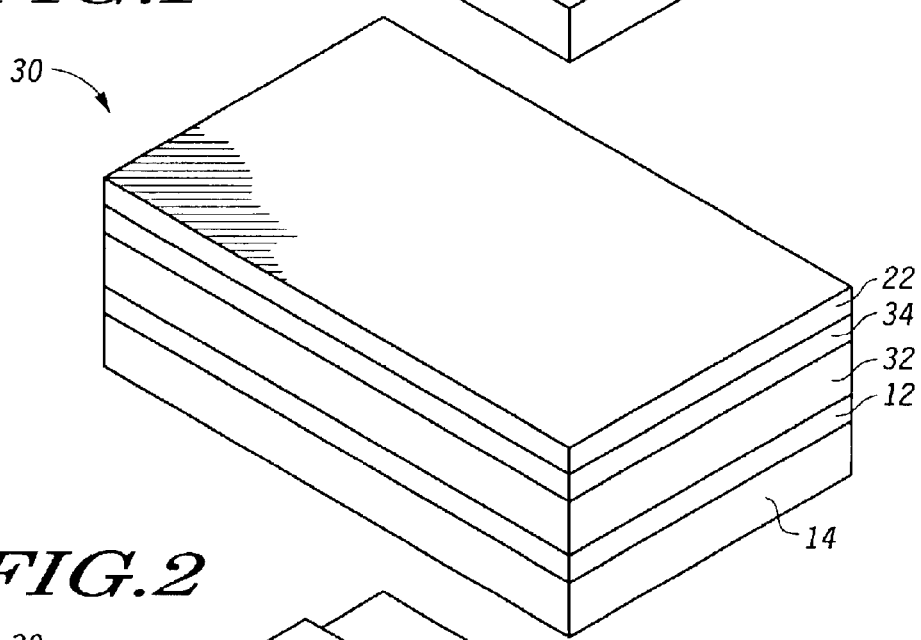
FIGS. 2 through 9 provide diagrams of successive structures of a process flow for one embodiment of the present invention.

FIGS. 2 through 9 are perspective views illustrating steps in fabricating polysilicon FinFET 10 in accordance with one embodiment of the invention. In FIG. 2, substrate structure 30 may be formed by appropriate chemical and/or plasma deposition process to include silicon substrate 14, buried oxide or dielectric insulative layer 12, and amorphous silicon layer 32. Insulative layer 12 may be, for example, a $SiO_2$, nitride or other material layer which insulates silicon substrate 14 from amorphous silicon layer 32. Deposition of amorphous silicon layer 32 may occur in an RTP-LPCVD, LPCVD or PVD process chamber at a temperature of less than 500C for furnace LPCVD or PVD process or approximately 600° C. for RTP-LPCVD. On the exposed major surface of amorphous silicon layer 32 is formed silicon germanium layer 34 and hard mask layer 22 of an insulating material such as silicon oxide, silicon nitride, a low dielectric constant material, or other suitable etchant insulator which allows the use of aggressive etch chemistries such as plasma etching while protecting underlying materials.

Figure 3:
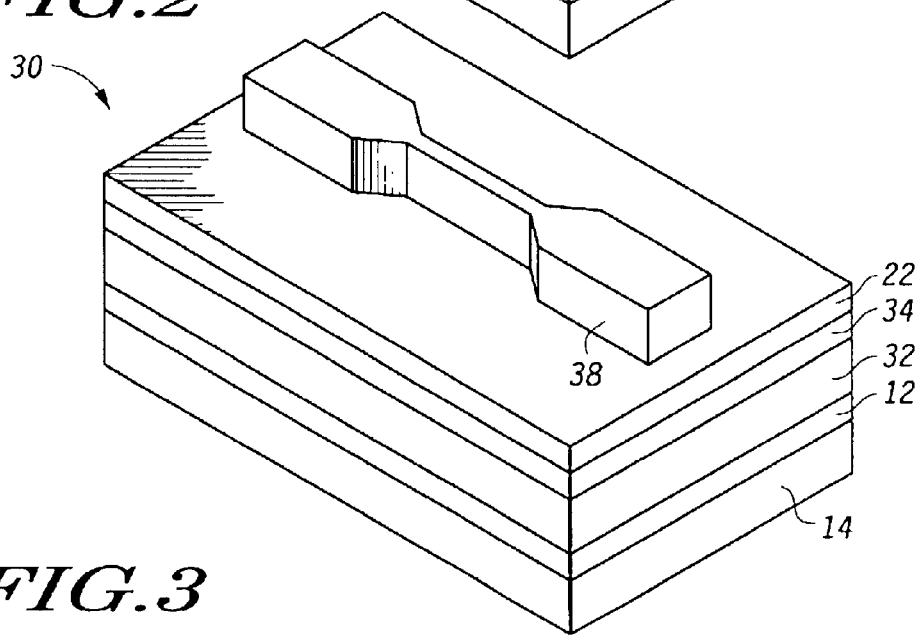
Figure 4:
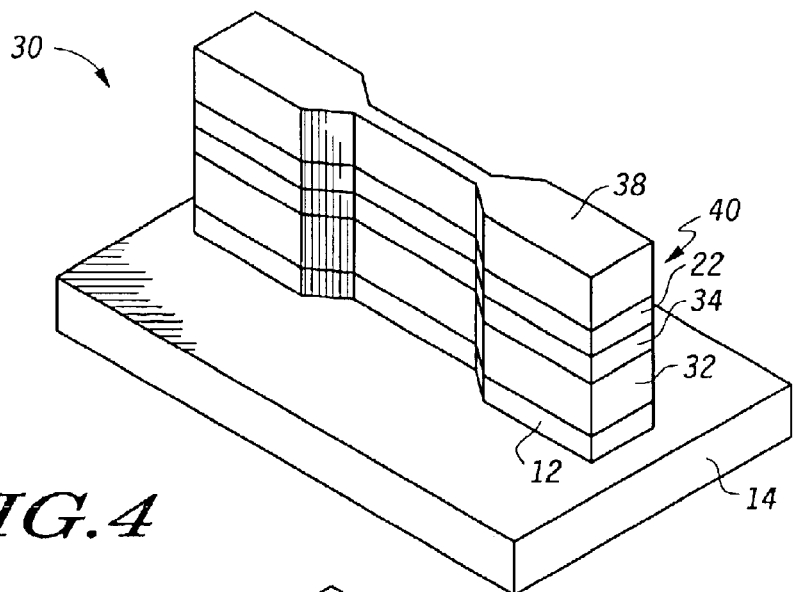

After the hard mask layer 22 deposition, a photoresist is applied to define a pattern that through optical lithography, electron beam lithography, x-ray lithography, or other conventional means, produces a chemical etchant mask 38 as shown in FIG. 3. The orientation of chemical etchant mask 38 on the surface of the wafer (and, therefore, the underlying Fin to be etched) may be chosen to enhance electrical properties of the device such as carrier mobility relative to the crystallographic orientation of the silicon substrate 14.

After the chemical etchant mask 38 definition, an etch process is used to etch down to silicon substrate 14 leaving behind fin structure 40. Fin structure 40, in the present embodiment includes the patterned portions of insulative layer 12, amorphous silicon layer 32, silicon germanium layer 34, and hard mask layer 22 remaining under chemical etchant mask 38. Thereafter, chemical etchant mask 38 is removed.

The use of amorphous silicon layer 32 is advantageous, not only for the inherent cost savings in using amorphous silicon, but also because the fabrication process can be conducted at a relatively low temperature of 400° C., or even lower. Formation at a low temperature helps reduce nucleation sites within amorphous silicon layer 32. This aids in reducing the number of grain boundaries within amorphous silicon layer 32. However, amorphous silicon, as used in amorphous silicon layer 32, still exhibits extremely low carrier mobility (i.e., electron mobility and hole mobility). Thus, amorphous silicon, without an annealing step such as that included in embodiments of the present invention, is not particularly effective for use in thin film transistors or FinFET devices.

Figure 5:
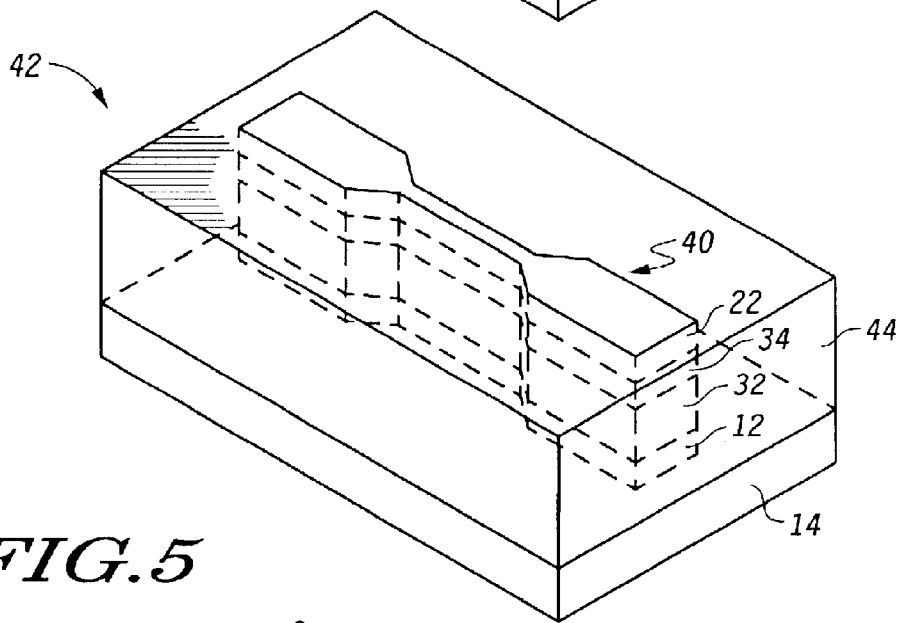

FIG. 5 shows annealing structure 42 which includes fin structure 40 surrounded by epitaxial silicon germanium seed layer 44. Fin structure 40 of FIG. 5 shows that chemical etchant mask 38 has been removed and includes insulative layer 12, amorphous silicon layer 32, silicon germanium layer 34, and hard mask layer 22. Epitaxial silicon germanium seed layer 44 may formed in using silicon substrate 14 as a seed for epitaxial growth that may reach, for example, a level approximating the height of fin structure 40. As such, epitaxial silicon germanium seed layer 44 presents a side wall to fin structure 40, a portion of which interfaces amorphous silicon layer 32. In other words, annealing structure 42 provides to amorphous silicon layer 32 a silicon germanium sidewall formed by epitaxial silicon germanium seed layer 44, as well as a silicon germanium covering by silicon germanium layer 34.

Amorphous silicon layer 32 is then annealed in the presence of the surrounding silicon germanium layer 34 to crystallize the silicon and produce a grain structure of sufficiently large size to enhance carrier mobility. Annealing to produce this affect may be accomplished, for example, by either using a low temperature global anneal (i.e. an anneal or heating of the entire substrate at a temperature of less than approximately 600° C.) or a localized laser anneal of the Fin structure. The laser anneal may be preferred if Fin structure 40 is to be included in multilayer or three-dimensional integrated circuit (e.g. see FIGS. 11 and 12) because the extent of heating can be controlled to specific depths and layers within the structure. Thus, underlying circuitry is not adversely affected by the anneal, which may not be the case with a global anneal.

In performing a laser anneal, irradiation by a high energy beam such as a laser beam or a light emitted from a Xenon lamp, is used to anneal amorphous silicon layer 32 so that it becomes molten and recrystallizes. Annealing through the use of high energy beam irradiation is referred hereinafter collectively as "laser annealing." The laser energy for a laser anneal of amorphous silicon layer 32 may be that of an excimer laser beam that is pulsed at a period of a few nanoseconds to achieve a temperature in amorphous silicon layer 32 of approximately 900° C. or more. Laser annealing may be carried out in an atmosphere under atmospheric pressure or reduced pressure. Through this process, amorphous silicon layer 32 melts, without other portions of fin structure 40, or other portions of the overall substrate, experiencing the laser energy. The regions are then cooled to room temperature to permit the silicon to recrystallize, thereby forming a polysilicon layer.

Without epitaxial silicon germanium seed layer 44 and silicon germanium layer 34, a polysilicon layer obtained by annealing would exhibit low carrier mobility as compared with a single crystal semiconductor material, such as the silicon used for the more expensive SOI structure. As a result, the semiconductor characteristics of a polysilicon layer obtained without epitaxial silicon germanium seed layer 44 and silicon germanium layer 34 would suffer from poor reproducibility and scattering of the mobility values, as compared to those values obtained from a single crystal semiconductor material.

However, during the annealing process (either global or localized), epitaxial silicon germanium seed layer 44 and silicon germanium layer 34 both promote the recrystallization of amorphous silicon layer 32 to form a polysilicon layer having significantly larger grain sizes and fewer grain boundaries. At temperatures of approximately 600° C. and below, the more slowly the annealing occurs, the larger will be the crystalline grains in the resulting polysilicon layer. Accordingly, within the limits of other process considerations, a slow, low temperature annealing step will be preferred to optimize the performance characteristics of the resulting polysilicon layer. A localized laser anneal can achieve the same result with the presence of silicon germanium layer 44.

Figure 6:
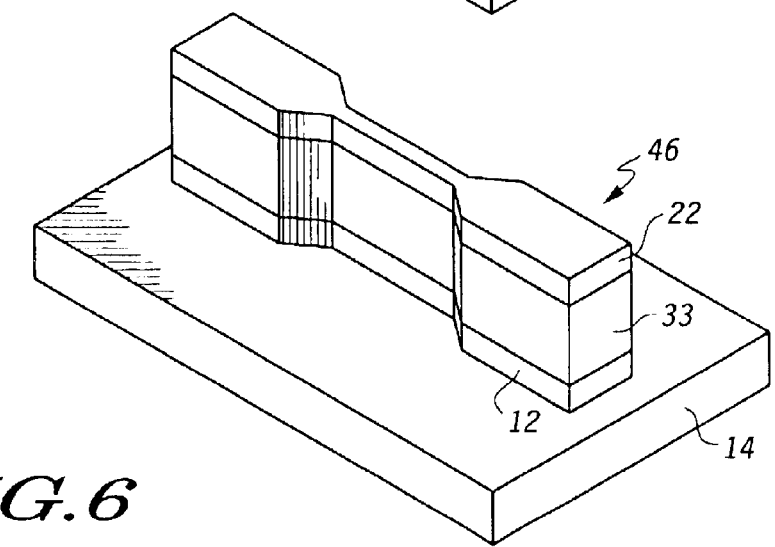

After the annealing process and the associated catalysis of larger grain size growth, the process removes epitaxial silicon germanium seed layer 44 down to silicon substrate 14 using a wet or dry chemical etch that is selective to silicon and using hard mask 22 to protect what will be the final fin structure. To perform this etch, a wet etch may be one using a mixture of NH4OH+H2O2+deionized water chemistry or a dry etch such as a chlorine-, SF4-, or CF4-based silicon etch that is selective to silicon to remove the silicon germanium seed layer without adversely affecting the adjacent silicon or other layers of fin structure 40. FIG. 6 shows the remaining fin structure 46. As a result of the annealing process, germanium from silicon germanium layer 34 and from silicon germanium seed layer 44 will diffuse into the underlying and adjacent polysilicon layer (i.e. into layer 32), forming a more homogenous material of germanium doped silicon rather than separate and distinct layers of silicon germanium and silicon. Accordingly, FIG. 6 illustrates a single layer 33 of germanium doped polysilicon. The resulting fin structure also includes insulative layer 12 and hard mask layer 22. Fin structure 46 is now ready to undergo FinFET fabrication processing to form the gate, and source/drain regions as the following discussion explains.

It should also be noted that, although the present embodiment describes the formation of fin structure 40 prior to annealing amorphous silicon layer 32, this sequence is not necessary. Annealing may occur prior to fin structure 40 formation. In such case, silicon germanium layer 34, alone and not in conjunction with epitaxial silicon germanium seed layer 44, could provide the single crystal seed catalyst for promoting large grain formation and the associated reduction in grain boundaries within the resulting polysilicon layer. The resulting polysilicon layer could then be masked and etched to form the fin. After fin structure 40 formation, a sacrificial oxidation process may be used to repair any damage done to the fin structure 40 during the fin etch and polysilicon recrystallization process.

Next, a gate dielectric is grown on exposed silicon and germanium doped silicon surfaces. For the sake of clarity of the drawings, the actual oxide layer is not shown but would cover all sidewalls of fin structure 46 as well as exposed portions of silicon substrate 14. The gate oxide may be grown in accordance with conventional thermal oxidation techniques. Alternatively, a deposition process could be used if sidewall coverage of the fin is sufficient.

Figure 7:
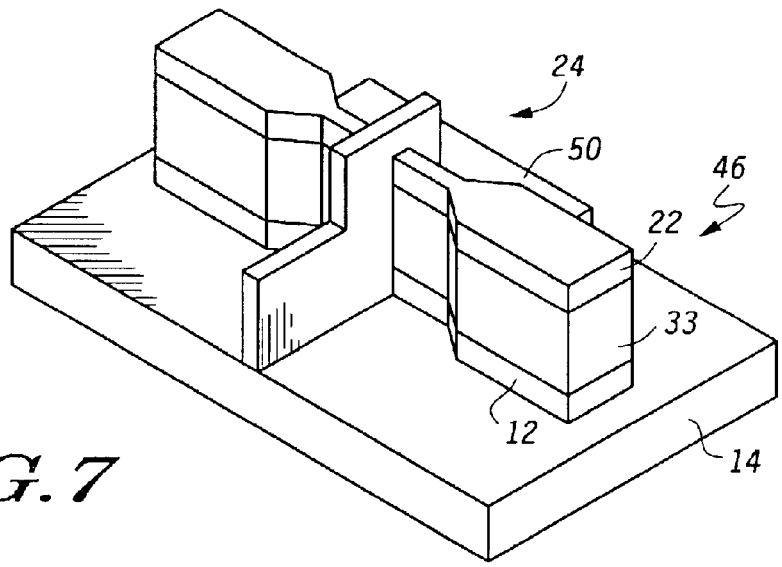
Figure 8:
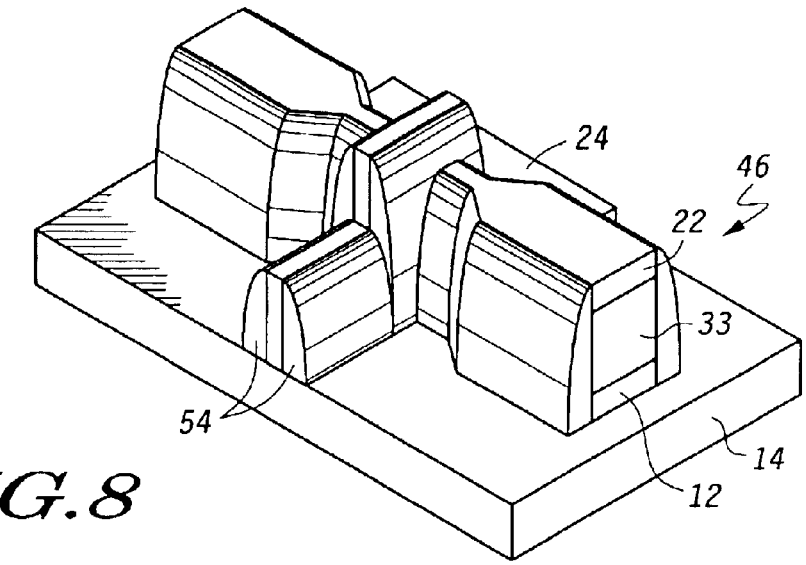

After formation of the gate dielectric, the gate electrode 24 is formed as shown in FIG. 7. To form the gate, a gate material (e.g. polysilicon, a refractory metal, or compounds such as titanium nitride, molybdenum, or other suitable conductive material) is deposited, patterned and etched into the desired shape and configuration. The patterning and etching process are performed using conventional photolithography and etch techniques. During the etch, hard mask 22 protects fin structure 46 while the gate dielectric protects silicon substrate 14. Hard mask 22 electrically isolates a small portion of gate 24 from the underlying portions of fin structure 46 (more specifically that portion on the top surface of the fin). Alternatively, the hard mask 22 can be removed completely before the gate dielectric formation so that the gate dielectric is grown on the top surface of the fin structure as well. With this alternative, the complete gate 24 wrap around the channel 20 of fin structure 46. By wrapping around channel 20, gate 24 provides and inherently self-aligned double gale structure, with or without hard mark 22, thus making it possible to demonstrate the FinFET structure's characteristics and benefits.

After formation of gate 24, a light implant of appropriate dopants may be used to form a lightly doped drain (LDD) or extension region. This can be accomplished with or without hard mask 22 in place. Since it is desirable to form the extension regions across or along the Fin height, an angle implant is preferred. The extension regions are formed in the fin structure and are self-aligned to gate 24. Following extension implants, sidewall spacers 54 (FIG. 8) are formed along sidewalls of the gate and fin structure to provide a mechanism for forming self-aligned source and drain regions in the fin. To form spacers, an insulating material, preferably silicon nitride, is deposited across the entire substrate and anisotropically etched in a conventional manner to leave nitride spacers along vertical sidewalls of underlying structures. The top surface of the fin structure will become exposed. Hard mask 22 may be fully or partially removed as part of the etch of the spacer material (especially if both are nitride). Ion implantation is then performed to form source and drain regions in the fin, using the spacers to define the implant offset from the gate (and thus be self-aligned thereto). Again, angled shallow ion implants of the germanium doped polysilicon layer 33 may be used to achieve doping within the height of the Fin (although the spacers will affect the penetration of the dopants). Alternatively, vertical implants (perpendicular to the major substrate surface) could also or instead be used. Any implant damage or amorphization as a result of any implant can be further annealed through subsequent exposure to elevated temperatures.

Figure 9:
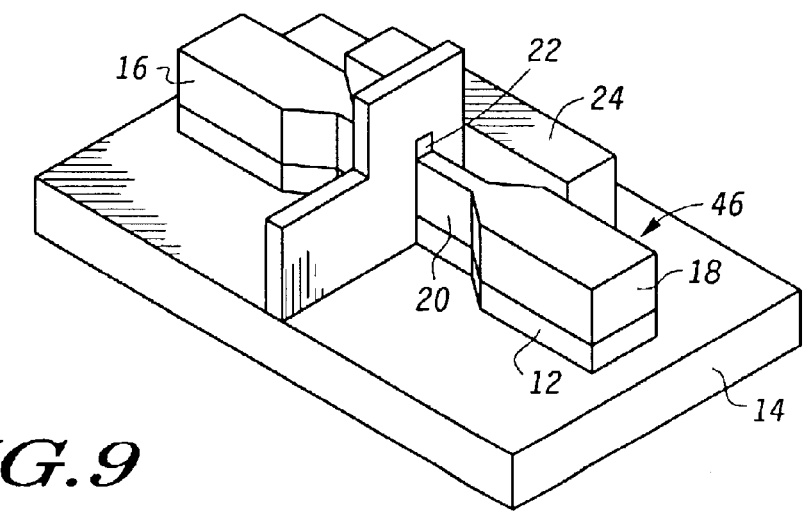

FIG. 9 shows gate 24 completely wrapping around the fin channel 20. Also, the spacers have been removed from FIG. 9, although this is not a requirement of the invention. By wrapping around fin channel 20, gate 24 is inherently self-aligned, thus providing the desirable FinFET performance characteristics. At this point, fin structure 46 may be subjected to a silicide process, using silicides that consume small amounts of silicon, such as nickel suicide or palladium silicide. Other possible silicides include titanium silicide and cobalt silicide. Contacts to the various transistor electrodes (source, drain, and gate) can then be formed in accordance with any over numerous conventional techniques.

Figure 10:
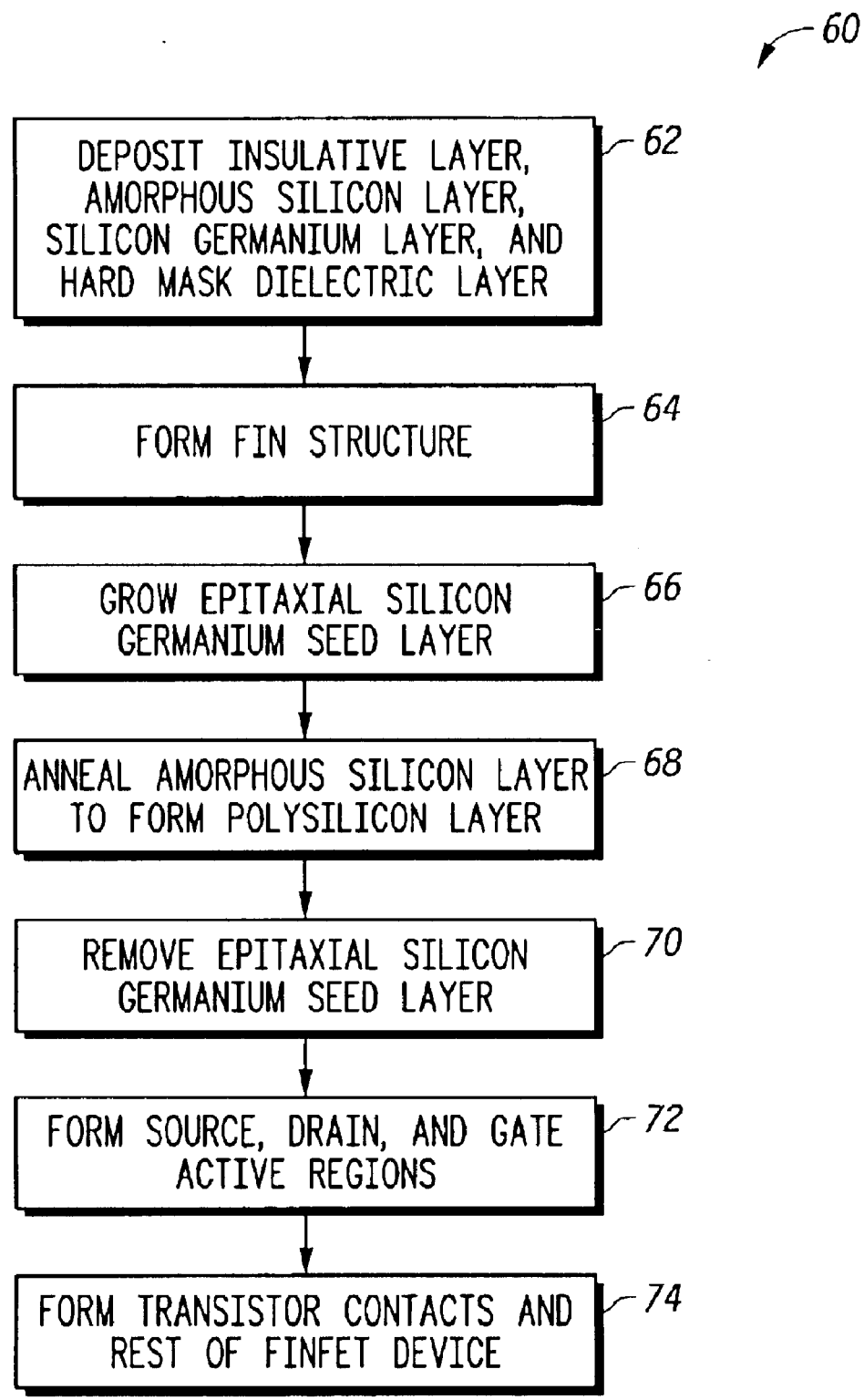
FIG. 10 provides a process flow diagram for the steps of the embodiment appearing in FIGS. 2 through 9.

FIG. 10 shows a process flow diagram 60 that further highlights the steps for forming a polysilicon FinFET 10 according to the above-described embodiment of the invention. Thus, step 62 refers to the formation of substrate structure 30, including the deposition of insulative layer 12, amorphous silicon layer 32, silicon germanium layer 34, and hard mask dielectric layer 36 over silicon substrate 14.

Formation of fin structure 40 through the above-described lithographic process (FIG. 3 and 4) may occur at step 64. At step 66, epitaxial silicon germanium seed layer 44 is grown. Annealing amorphous silicon layer 32 to form polysilicon layer occurs at step 68. Removal of epitaxial silicon germanium seed layer 44 occurs at step 70. This permits the subsequent formation of the active transistor source 16, drain 18, and gate 24 within and over the fin at step 72. Thereafter, contact formation and other steps for completing the formation of polysilicon FinFET 10 according to known FinFET and thin film transistor processing techniques may occur at step 74.

Figure 11:
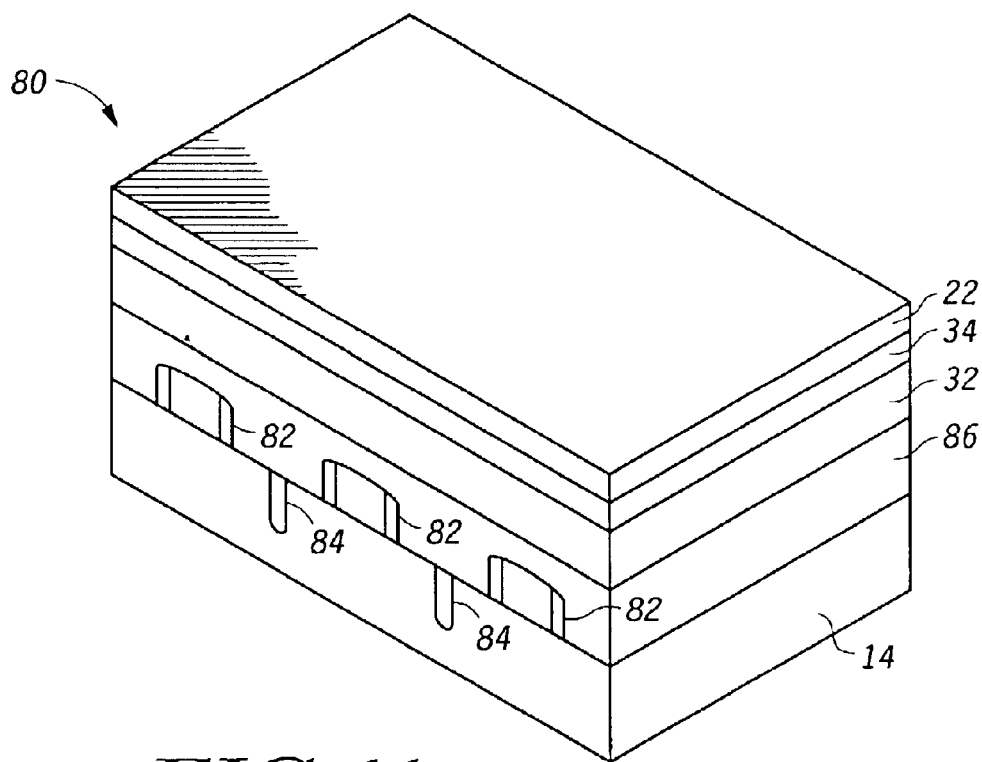
FIGS. 11 and 12 depict selected stages of a fabrication process for an alternative embodiment of a polysilicon FinFET formed according to the present invention, as part of three-dimensional integrated circuit.

FIG. 11 illustrates another aspect of the present invention which permits the formation of polysilicon FinFET 10 as part of a multi-layer or three-dimensional integrated circuit. Multi-layer substrate structure 80 of FIG. 11 includes silicon substrate 14 on which a number of devices 82 have been formed by an already-completed process. Such devices may be logic devices, memory devices, other polysilicon FinFETs 10, or other integrated circuit devices and may include associated recessed features 84. Over devices 82 and recessed features 84, the process forms device insulative layer 86, amorphous silicon layer 32, silicon germanium layer 34, and hard mask dielectric layer 22.

Note that multi-layer substrate structure 80, at this point, has a structure similar to that of substrate structure 30 of FIG. 2, above. However, instead of amorphous silicon layer 32 covering insulative layer 12, as in FIG. 2, amorphous silicon layer 32 now covers device insulative layer 86. Fabrication process flow, nonetheless, may proceed as described in FIGS. 3 through 9, above, with one exception. The exception is that formation of a polysilicon FinFET 10 on device insulative layer 86 cannot include etching down to silicon substrate 14 without affecting in at least some way the underlying devices 84 and recessed features. Accordingly, silicon substrate 14 is not accessible to seed the growth of epitaxial silicon germanium seed layer 44. Silicon germanium layer 34, instead, provides the annealing process recrystallization seed. As previously described, silicon germanium layer 34 catalyzes large grain growth and a lower number of grain boundaries to optimize the carrier mobility characteristics of the polysilicon layer, resulting from the above-described low temperature or localized laser anneal process.

Figure 12:
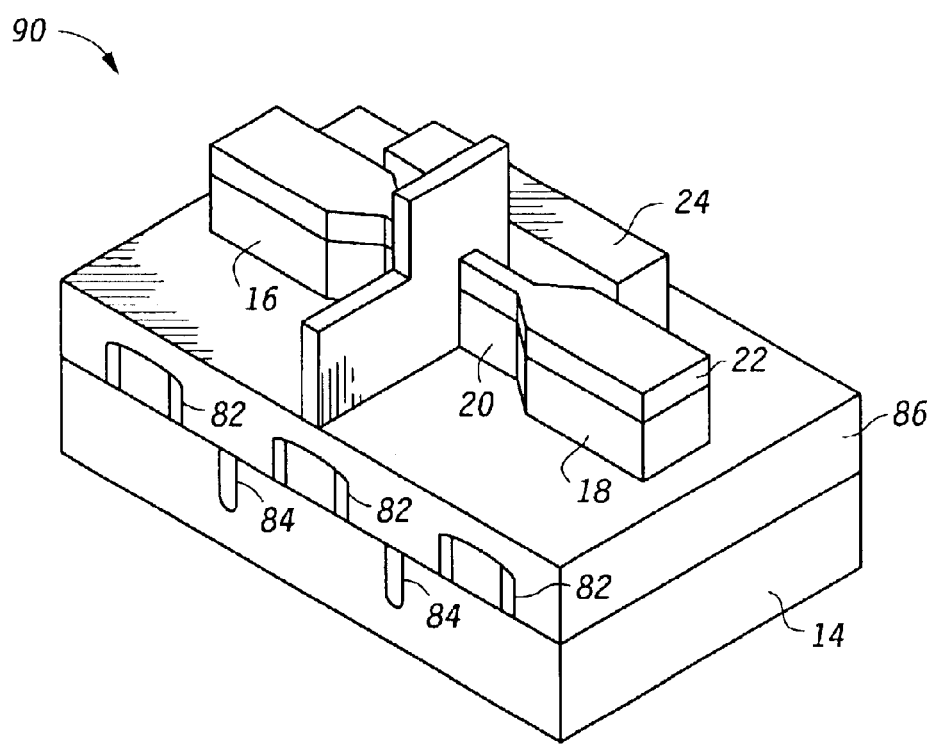

FIG. 12 depicts a resulting multi-layer polysilicon FinFET structure 90 formed from multi-layer substrate structure 80 and the process steps of the present invention. Multi-layer polysilicon FinFET structure 90 may include polysilicon FinFET 10 formed over device insulative layer 86.

Microprocessors may effectively use multi-layer polysilicon FinFET structure 90 in a number of ways. For instance, memory circuits for many microprocessor applications have lower performance requirements than do their associated logic circuits. A multi-layer polysilicon FinFET 90, however, may satisfy many memory integrated circuit operational requirements. A multi-layer microprocessor integrated circuit could be formed wherein a logic circuit formed at the substrate level occupies the level. Then, the microprocessor memory circuit may be fabricated to include an array of multi-layer polysilicon FinFETs 90 over the logic circuitry on a layer such as device insulative layer 86. Today, approximately one-half to two-thirds of a microprocessor circuit's area constitutes memory device circuitry. So, using such a two-layer approach could significantly reduce microprocessor circuit sizes.

Figure 13:
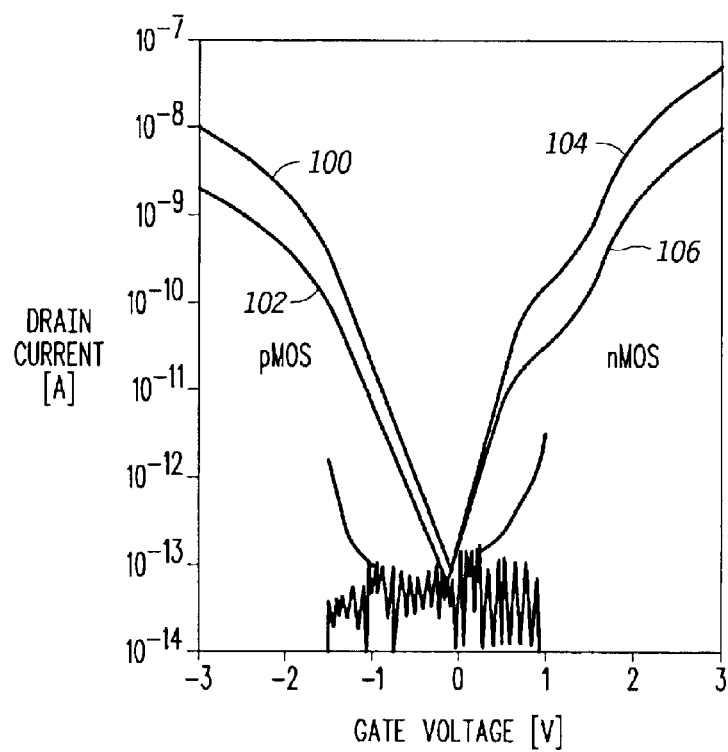
FIGS. 13 and 14 show, respectively, performance measurements of long-channel and short-channel polysilicon FinFETs form according to the teachings of the present invention.
Figure 14:
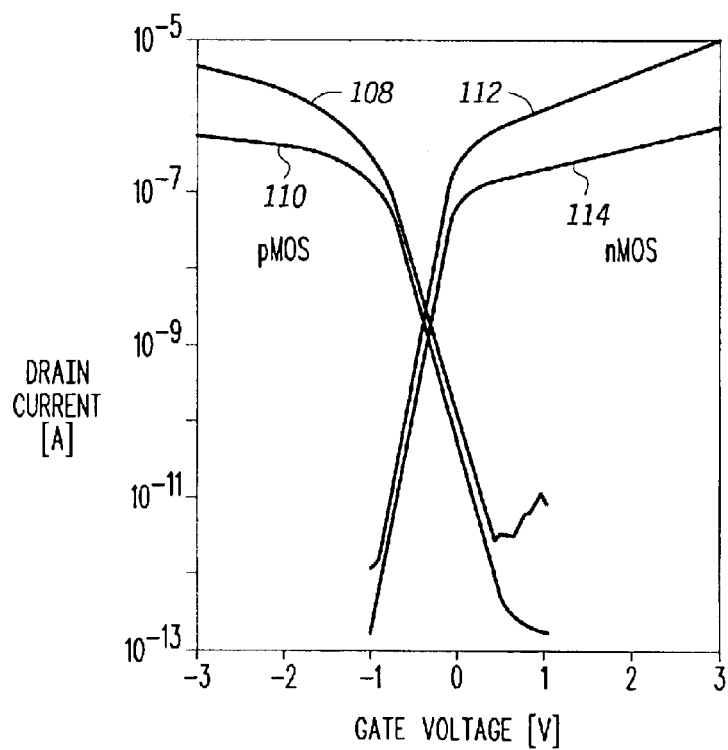

Polysilicon FinFETs formed in accordance with present invention exhibit desirable transistor characteristics in both long channel and short channel configurations. The performance of two samples, a 10-$\mu$m long channel FinFET and 0.6-$\mu$m short channel FinFET, both having channel widths of 0.2 $\mu$m, were analyzed. FIGS. 13 and 14 show, respectively, measures of drain current ($I_{ds}$) versus gate voltage ($V_{gs}$) at source-drain voltages ($V_{ds}$) ranging between +/−0.1 V and +/−1 V for the 10-$\mu$m FinFET (FIG. 13) and the 0.6 $\mu$m FinFET (FIG. 14).

FIG. 13 demonstrates that for the 10-$\mu$m FinFET, as $V_{gs}$ ranges from −3 to +3 volts, $I_{ds}$ steeply falls from the pMOS side. Line 100 relates to $V_{ds}$=−1.0 V and records a drop in $I_{ds}$ from approximately $10^{-8}$ A at $V_{gs}$=−3 V to approximately $10^{-13}$ A at $V_{gs}$=0V. Line 102 relates to $V_{ds}$=−0.1 V and records a drop in $I_{ds}$ from approximately $10^{-9}$ A at $V_{gs}$=−3 V to approximately $10^{-14}$ A at $V_{gs}$=0V. With rising $V_{gs}$, on NMOS side, $I_{ds}$ sharply rises. Line 104 relates to $V_{ds}$32 +1.0 V and records a rise in $I_{ds}$ from approximately $10^{-13}$ A at $V_{gs}$=0 V to approximately $10^{-7}$ A at $V_{gs}$=+3V. Line 106 relates to $V_{ds}$=+0.1 V and records a rise in $I_{ds}$ from approximately $10^{-13}$ A at $V_{gs}$=0 V to approximately $10^{-8}$ A at $V_{gs}$=+3V.

FIG. 14 demonstrates that for the 0.6-$\mu$m FinFET, as $V_{gs}$ ranges from −3 to +3 volts, $I_{ds}$ steeply falls on the pMOS side. Line 108 relates to $V_{ds}$=−1.0 V and records a drop in $I_{ds}$ from approximately $10^{-5}$ A at $V_{gs}$=−3 V to approximately $10^{-13}$ A at $V_{gs}$=0V. Line 110 relates to $V_{ds}$32 −0.1 V and records a drop in $I_{ds}$ from approximately $10^{-6}$ A at $V_{gs}$=−3 V to approximately $10^{-13}$ A at $V_{gs}$=0V. With rising $V_{gs}$, on the NMOS side, $I_{ds}$ sharply rises. Line 112 relates to $V_{ds}$32 +1.0 V and records a rise in $I_{ds}$ from approximately $10^{-12}$ A at $V_{gs}$=−1 V to approximately $10^{-5}$ A at $V_{gs}$=+3V. Line 114 relates to $V_{ds}$=+0.1 V and records a rise in $I_{ds}$ from approximately $10^{-13}$ A at $V_{gs}$=−1 V to approximately $10^{31\ 6}$ A at $V_{gs}$=+3V.

The results that FIGS. 13 and 14 depict were based on experimental polysilicon FinFETs. Through quality improvement and related production processes, it should be expected that performance characteristics will improve. Nonetheless, for both a long channel polysilicon FinFET and a short channel polysilicon FinFET, it has been shown that the present invention gives acceptable transistor performance.

The material costs for polysilicon FinFETs of the present invention are significantly lower that those of similarly functioning devices. In part, this is due to the fact that, instead of requiring the use of expensive planar SOI wafers as do many known FinFET structures, the present invention may use a polysilicon film that has been formed at a low temperature over a nitride insulator, oxide insulator or other types of insulative layers.

With the present invention, there is also no need to use complex semiconductor device fabrication and assembly equipment which other double gated thin film transistor structures may require. That is, the process of the present invention makes possible a double-gated thin film transistor without requiring bonding equipment and their associated processes. Also owing to the present process simplicity, a resulting polysilicon FinFET may be formed over not only a single-layer planar substrate, but also on a non-planar surface.

Thus, it is apparent that the present invention provides a method for forming a polysilicon FinFET having two gates modulating a double-gated channel built over a dielectric or similar insulative material. Although the invention has been described and illustrated with reference to specific embodiments, it is not intended that the invention be limited to these illustrative embodiments. Those skilled in the art will recognize that modifications and variations can be made without departing from the spirit of the invention. For example, the invention is not limited to the particular size or dimensions illustrated. In addition, the invention is not limited to any particular type of integrated circuit described herein. Furthermore, a polysilicon FinFET formed according to the teachings of the present invention may undergo or become part of a different or more complex fabrication process, provided, however, that the essential characteristics of the present invention exist in the process. Therefore, it is intended that this invention encompass all such modifications and variations which fall within the scope of the appended claims.

We claim:

1. A method for forming a double-gated transistor, comprising the steps of:
   forming an insulative layer over a substrate;
   forming an amorphous silicon layer over said insulative layer for producing a polysilicon layer;
   forming a silicon germanium seed layer associated with said amorphous silicon layer for controlling silicon grain growth in producing said polysilicon layer;
   forming said polysilicon layer using an annealing step applied to said amorphous silicon layer, said annealing step comprising the step of controlling said silicon grain growth using said silicon germanium seed layer; and
   forming a source, a drain, and a channel from said polysilicon layer, said channel comprising a double-sided vertical fin structure; and
   forming a gate in association with said channel and around said double-sided vertical fin structure for forming said polysilicon double-gated transistor.

2. The method of claim 1, wherein said insulative layer forming step further comprises the step of forming a SiO$_2$ insulative layer over said semiconductor substrate.

3. The method of claim 1, wherein said insulative layer forming step further comprises the step of forming a nitride insulative layer over said semiconductor substrate.

4. The method of claim 1, wherein said amorphous silicon layer forming step further comprises the step of forming said amorphous silicon layer over said insulative layer at a temperature of approximately less than 500° C.

5. The method of claim 1, wherein said silicon germanium seed layer forming step further comprises the step of forming a silicon germanium seed layer comprising a silicon germanium sidewall in association with said amorphous silicon layer for controlling silicon grain growth in producing said polysilicon layer.

6. The method of claim 1, wherein said amorphous silicon layer forming step further comprises the step of forming said amorphous silicon layer using a process temperature of less than approximately 600° C. in an RTP-LPCVD process chamber.

7. The method of claim 1, wherein said amorphous silicon layer forming step further comprises the step of forming said amorphous silicon layer using a process temperature of less than approximately 500° C. in an LPCVD process chamber.

8. The method of claim 1, wherein said polysilicon layer forming step further comprises the step of forming said polysilicon layer using an anneal process temperature of less than approximately 600° C.

9. The method of claim 1, wherein said polysilicon layer forming step further comprises the step of forming said polysilicon layer using a localized laser anneal step.

10. A method for forming a self-aligned double-gated transistor, comprising the steps of:
    depositing an insulative layer over a substrate;
    depositing an amorphous silicon layer over said insulative layer;
    depositing a silicon germanium seed layer in association with said amorphous silicon layer;
    annealing said amorphous silicon layer for recrystallizing said amorphous silicon layer into a polysilicon layer, said polysilicon layer having crystalline structure formations controlled by said silicon germanium seed layer;
    etching said polysilicon layer for defining a source, a drain, and a channel between said source and said drain; and
    forming a double-gate electrode over said channel for forming a double-gated transistor, said double-gated electrode having two self-aligned gates.

11. The method of claim 9, further comprising the step of forming said self-aligned double-gated transistor as a polysilicon FinFET within a multi-layer integrated circuit.

12. The method of claim 10, further comprising the step of forming said self-aligned double-gated transistor as a thin film transistor FinFET.

13. A method for forming a multi-layer integrated circuit, comprising the steps of:
    forming a first layer integrated circuit and a second layer integrated circuit, said first layer integrated circuit formed between a substrate and said second layer integrated circuit,
    forming said second layer integrated circuit to include a double-gated polysilicon transistor, said double-gated polysilicon transistor formed according to a method comprising the steps of:
        forming an insulative layer for isolating said first layer integrated circuit from said double-gated polysilicon transistor;
        forming an amorphous silicon layer over said insulative layer for yielding a polysilicon layer;
        forming a silicon germanium seed layer associated with said amorphous silicon layer for controlling silicon grain growth in producing said polysilicon layer;
        forming said polysilicon layer using an annealing step applied to said amorphous silicon layer, said annealing step comprising the step of controlling said silicon grain growth using said silicon germanium seed layer; and
        forming a source, a drain, and a channel for said double-gated polysilicon transistor from said polysilicon layer, said channel comprising a double-sided vertical fin structure; and
        forming a gate in association with said channel and around said double-sided vertical fin structure for forming said double-gated polysilicon transistor.

14. The method of claim 13, further comprising the step of forming said second layer integrated circuit as a memory circuit.

15. The method of claim 13, further comprising the step of forming said first layer integrated circuit as a logic circuit.

16. The method of claim 13, wherein said insulative layer forming step further comprises the step of forming a SiO$_2$ insulative layer over said substrate.

17. The method of claim 13, wherein said insulative layer forming step further comprises the step of forming a nitride insulative layer over said substrate.

18. The method of claim 13, wherein said amorphous silicon layer forming step further comprises the step of forming an amorphous silicon layer over said insulative layer at a temperature of approximately less than 700° C.

19. The method of claim 13, wherein said silicon germanium seed layer forming step further comprises the step of forming a silicon germanium seed layer comprising a silicon germanium sidewall for associating with said amorphous silicon layer and thereby controlling silicon grain growth in producing said polysilicon layer, said silicon germanium seed layer forming step occurring at a temperature of less than approximately 600° C.

20. The method of claim 13, wherein said polysilicon layer forming step further comprises the step of forming said polysilicon layer using a temperature of less than approximately 600° C. during said annealing step.

21. The method of claim 13, wherein said polysilicon layer forming step further comprises the step of forming said polysilicon layer using localized laser energy source during said annealing step.

* * * * *

UNITED STATES PATENT AND TRADEMARK OFFICE
CERTIFICATE OF CORRECTION

PATENT NO. : 6,838,322 B2 Page 1 of 1
DATED : January 4, 2005
INVENTOR(S) : Daniel T. Pham et al.

It is certified that error appears in the above-identified patent and that said Letters Patent is hereby corrected as shown below:

<u>Column 10,</u>
Line 52, change "gale" to -- gate --.

Signed and Sealed this

Fourth Day of April, 2006

JON W. DUDAS
*Director of the United States Patent and Trademark Office*